US011075081B2

(12) United States Patent
Joseph et al.

(10) Patent No.: US 11,075,081 B2
(45) Date of Patent: *Jul. 27, 2021

(54) SEMICONDUCTOR DEVICE WITH MULTIPLE THRESHOLD VOLTAGES

(71) Applicant: International Business Machines Corporation, Armonk, NY (US)

(72) Inventors: Praveen Joseph, Albany, NY (US); Indira Seshadri, Niskayuna, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

This patent is subject to a terminal disclaimer.

(21) Appl. No.: 16/658,819

(22) Filed: Oct. 21, 2019

(65) Prior Publication Data
US 2020/0098570 A1 Mar. 26, 2020

Related U.S. Application Data

(63) Continuation of application No. 16/139,244, filed on Sep. 24, 2018, now Pat. No. 10,665,461.

(51) Int. Cl.
*H01L 21/28* (2006.01)
*H01L 29/78* (2006.01)
(Continued)

(52) U.S. Cl.
CPC .... *H01L 21/28088* (2013.01); *H01L 21/0337* (2013.01); *H01L 21/3086* (2013.01);
(Continued)

(58) Field of Classification Search
CPC ............ H01L 21/28088; H01L 21/0337; H01L 21/3086; H01L 27/088; H01L 29/4966; H01L 29/7827
(Continued)

(56) References Cited

U.S. PATENT DOCUMENTS 5,618,743 A 4/1997 Williams et al.
6,040,609 A 3/2000 Frisina et al.
(Continued)

OTHER PUBLICATIONS

List of IBM Patents or Patent Applications Treated as Related.

*Primary Examiner* — Igwe U Anya
(74) *Attorney, Agent, or Firm* — Abdy Raissinia; Ryan, Mason & Lewis, LLP

(57) ABSTRACT

A method for fabricating a semiconductor device with multiple threshold voltages includes masking a substrate structure to selectively form work-function metal layers on vertical field effect transistors. In the method, a first work function metal layer is formed on a high-k dielectric layer of a substrate structure comprising vertical field effect transistors. The first work function metal layer and the high-k dielectric layer are etched to form gate regions for each vertical field effect transistor. A resist mask is formed over a first of the vertical field effect transistors. The resist mask isolates the first of the vertical field effect transistors from a second of the vertical field effect transistors. A second work function metal layer is selectively formed on the first work function metal layer of the gate region of the second of the vertical field effect transistors. The resist mask is then removed.

20 Claims, 10 Drawing Sheets

(51) Int. Cl.
*H01L 21/308* (2006.01)
*H01L 21/033* (2006.01)
*H01L 29/49* (2006.01)
*H01L 27/088* (2006.01)

(52) U.S. Cl.
CPC ........ *H01L 27/088* (2013.01); *H01L 29/4966* (2013.01); *H01L 29/7827* (2013.01)

(58) Field of Classification Search
USPC ........................................................ 257/239
See application file for complete search history.

(56) References Cited

U.S. PATENT DOCUMENTS

| | | |
|---|---|---|
| 7,855,105 B1 | 12/2010 | Jagannathan et al. |
| 8,309,447 B2 | 11/2012 | Cheng et al. |
| 9,177,865 B2 | 11/2015 | Kim et al. |
| 9,653,602 B1 | 5/2017 | Cheng et al. |
| 9,780,088 B1 | 10/2017 | Balakrishnan et al. |
| 9,953,973 B1 | 4/2018 | Balakrishnan et al. |
| 9,985,027 B2 | 5/2018 | Fan et al. |
| 10,665,461 B2 * | 5/2020 | Joseph ................. H01L 29/775 |
| 2012/0098599 A1 | 4/2012 | Chang et al. |
| 2017/0342553 A1 | 11/2017 | Yu et al. |
| 2017/0373167 A1 | 12/2017 | Bergendahl et al. |
| 2018/0012752 A1 | 1/2018 | Tapily |
| 2018/0337255 A1 | 11/2018 | Cheng et al. |

* cited by examiner

100

100

100

100

100

100

SEMICONDUCTOR DEVICE WITH MULTIPLE THRESHOLD VOLTAGES

TECHNICAL FIELD

This disclosure relates generally to semiconductor fabrication techniques and, in particular, to structures and methods for fabricating vertical field effect transistor (FET) devices.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

SUMMARY

Embodiments of the invention include vertical FET devices with multiple threshold voltages, as well as methods for fabricating vertical FET devices with multiple threshold voltages. According to an exemplary embodiment, a method for manufacturing a semiconductor device includes forming a first work function metal layer on a high-k dielectric layer of a substrate structure comprising vertical field effect transistors. The first work function metal layer and the high-k dielectric layer are etched to form gate regions for each vertical field effect transistor. The gate regions of a given one of the vertical field effect transistors comprise the first work function metal layer separated from a fin of the given one of the vertical field effect transistors by the high-k dielectric layer. A resist mask is formed over a first of the vertical field effect transistors. The resist mask isolates the first of the vertical field effect transistors from a second of the vertical field effect transistors. A second work function metal layer is selectively formed on the first work function metal layer of the gate region of the second of the vertical field effect transistors. The resist mask is then removed.

According to an exemplary embodiment of the present invention, a semiconductor device includes a first vertical field effect transistor comprising a first work function metal layer disposed on a high-k dielectric layer in a gate region of the vertical field effect transistor. The high-k dielectric layer separates the first work function metal layer from a fin of the vertical field effect transistor. The first vertical field effect transistor has a first threshold voltage based on a thickness of the first work function metal layer. The semiconductor device further includes a second vertical field effect transistor comprising the first work function metal layer disposed on the high-k dielectric layer in a gate region of the second vertical field effect transistor and a second work function metal layer disposed on the first work function metal layer. The second vertical field effect transistor has a second threshold voltage based on a combined thickness of the first work function metal layer and the second work function metal layer.

According to an exemplary embodiment of the present invention, a method for manufacturing a semiconductor device includes forming a first work function metal layer on a high-k dielectric layer of a substrate structure comprising vertical field effect transistors. The first work function metal layer and the high-k dielectric layer are etched to form gate regions for each vertical field effect transistor. The gate regions of a given one of the vertical field effect transistors comprise the first work function metal layer separated from a fin of a given one of the vertical field effect transistors by the high-k dielectric layer. A resist mask is formed over a first plurality of the vertical field effect transistors. The resist mask isolates the first plurality of the vertical field effect transistors from a second plurality of the vertical field effect transistors. A second work function metal layer is selectively formed on the first work function metal layer of the gate regions of the second plurality of the vertical field effect transistors. The resist mask is removed and a second resist mask is formed over the first plurality of the vertical field effect transistors and a first subset of the second plurality of the vertical field effect transistors. The second resist mask isolates the first plurality of the vertical field effect transistors and the first subset of the second plurality of the vertical field effect transistors from a second subset of the second plurality of the vertical field effect transistors. A third work function metal layer is selectively formed on the second work function metal layer of the gate regions of the second subset of the second plurality of the vertical field effect transistors. The second resist mask is removed.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
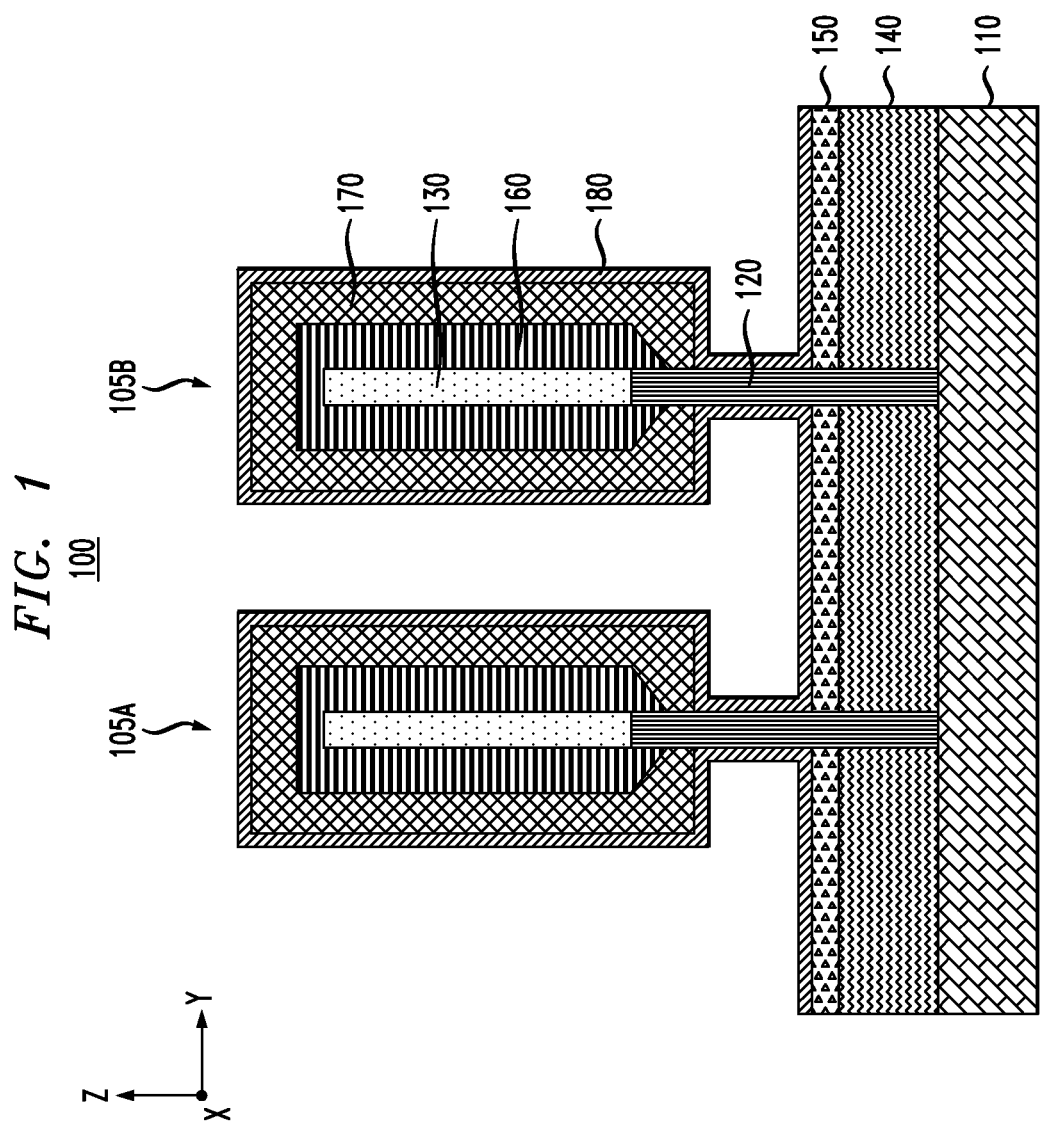
FIG. 1 is a cross-sectional view illustrating a substrate structure including vertical field effect transistors (VFETs) at an intermediate stage of fabrication, according to an exemplary embodiment of the present invention.

Exemplary embodiments of the invention will now be discussed in further detail with regard to semiconductor devices and methods of manufacturing same and, in particular, to forming vertical FET devices with multiple threshold voltages.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

The cross-sections in FIGS. 1-13 are taken perpendicular to the length of the fins along the substrate.

FIG. 1 is a cross-sectional view of a semiconductor structure 100 of a vertical FET semiconductor device at an intermediate stage of fabrication prior to the formation of a top source/drain. As shown in FIG. 1, the semiconductor structure 100 includes a pair of vertical FET devices 105A and 105B. While illustrated as a pair of vertical FET devices 105A and 105B, any number of vertical FET devices may be included in the semiconductor structure 100. Each of vertical FET devices 105A and 105B is formed from a plurality of layers including, for example, a fin 120, a fin hardmask 130, a bottom source/drain 140, a bottom spacer 150, a dielectric layer 160, an upper spacer 170, and a dielectric 180, that are sequentially formed on a semiconductor substrate 110, according to an embodiment of the invention.

In some embodiments, semiconductor substrate 110 includes semiconductor material including, but not limited to, silicon (Si), silicon germanium (SiGe), silicon carbide (SiC), carbon doped silicon (Si:C), silicon germanium carbide (SiGeC), carbon doped silicon germanium (SiGe:C), a group III-V, II-VI compound semiconductor material or other semiconductor material. In addition, multiple layers of the semiconductor materials can be used as the semiconductor material of the substrate. The semiconductor substrate 110 can be a bulk substrate or a semiconductor-on-insulator substrate such as, but not limited to, a silicon-on-insulator (SOI), silicon-germanium-on-insulator (SGOI) or group III-V-on-insulator substrate including a buried insulating layer, such as, for example, a buried oxide, nitride layer or aluminum oxide.

Fins 120 may be formed, for example, by patterning a semiconductor layer. The semiconductor layer may include, but is not necessarily limited to, Si, SiGe or group III-V materials, and may be epitaxially grown. According to an embodiment, a fin hardmask 130 including, for example, a dielectric material, such as silicon nitride (SiN), is formed on portions of the semiconductor layer that are to be formed into the fins 120. The fin patterning can be done by a combination of various patterning techniques, including, but not necessarily limited to, for example, a lithography process such as, e.g., extreme ultraviolet (EUV) lithography, 193 nm optical lithography, nanoimprint lithography, or other lithographic processes, and a directional etching process such as, e.g., a reactive ion etch (RIE), a sidewall image transfer (SIT) process such as self-aligned double patterning (SADP), self-aligned multiple patterning (SAMP), self-aligned quadruple patterning (SAQP), or combinations thereof. While embodiments of the present invention describe channel regions as fins, the embodiments are not necessarily limited to fin channel regions, and may include nanowire channel regions.

With continued reference to FIG. 1, in an exemplary embodiment, bottom source/drain 140 and bottom spacer 150 are formed using conventional fabrication techniques.

Bottom source/drain 140 is formed around the fins 120. For example, one or more trenches may be formed in the semiconductor substrate 110 by, for example, a wet or dry etch process. The bottom source/drain 140 can be formed in the trenches by bottom-up epitaxial growth processes (with optional dummy vertical dielectric liners covering fin sidewalls during epitaxial growth), wherein the bottom source/drain 140 is grown to a certain height (thickness) such as, but not necessarily limited to about 10 nm to about 50 nm. The epitaxially grown bottom source/drain 140 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The bottom spacer 150 includes, but is not necessarily limited to, silicon boron nitride (SiBN), siliconborocarbonitride (SiBCN), silicon oxycarbonitride (SiOCN), SiN or $SiO_x$. According to an embodiment of the present invention, the bottom spacer 150 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Spacer material from the formation of bottom spacer 150 formed on the fin hardmask 130 can be removed using a planarization process, such as, for example, CMP.

Dielectric layer 160 is formed on and around fin 120 and fin hardmask 130, for example, using conventional fabrication techniques. Dielectric layer 160 may comprise, but is not necessarily limited to, a silicon oxide ($SiO_x$), where x is, for example, 2 in the case of silicon dioxide ($SiO_2$), or 1.99 or 2.01, a low-temperature oxide (LTO), a high-temperature oxide (HTO), a flowable oxide (FOX), a silicon oxycarbide (SiOC), a silicon oxycarbonitride (SiOCN) or some other dielectric. The dielectric material may be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), selective atomic layer deposition (selective-ALD), molecular layer deposition (MLD), molecular beam deposition (MBD), pulsed laser deposition (PLD), liquid source misted chemical deposition (LSMCD), and/or sputtering, followed by a planarization process, such as, chemical mechanical planarization (CMP) to remove excess dielectric material. The patterning of the dielectric layer 160 can be performed using appropriate masking and removal techniques, including, but not necessarily limited to, RIE and optical lithography.

Top spacer 170 is formed on dielectric layer 160 and fin 120, for example, using conventional fabrication techniques. In some embodiments, the top spacer layer 170 may comprise, for example, SiN, SiBN, SiBCN, SiOCN or other similar dielectric materials. According to an embodiment of the present invention, the top spacer layer 170 is conformally deposited using, for example, deposition techniques including, but not limited to, CVD, PECVD, RFCVD, PVD, ALD, selective-ALD, MLD, MBD, PLD, LSMCD, sputtering, and/or plating. In some embodiments, excess material may be removed using a conventional technique such as, e.g., etching. For example, excess material of top spacer 170 may be etched back using A nitride-selective isotropic etching process.

High-k dielectric layer 180 is formed on the exposed surfaces of top spacer 170, fin 120, and bottom spacer 150. In some embodiments, for example, dielectric layer 180 may be a high-k dielectric layer such as, e.g., $HfO_2$ (hafnium oxide), $ZrO_2$ (zirconium dioxide), hafnium zirconium oxide $Al_2O_3$ (aluminum oxide), and $Ta_2O_5$ (tantalum pentoxide). In some embodiments, high-k dielectric layer 180 may be conformally deposited on the top and bottom spacers and around fins 120. High-k dielectric layer 180 will separate the gate material from the fin 120, top spacer 150, and bottom spacer 170.

Figure 2:
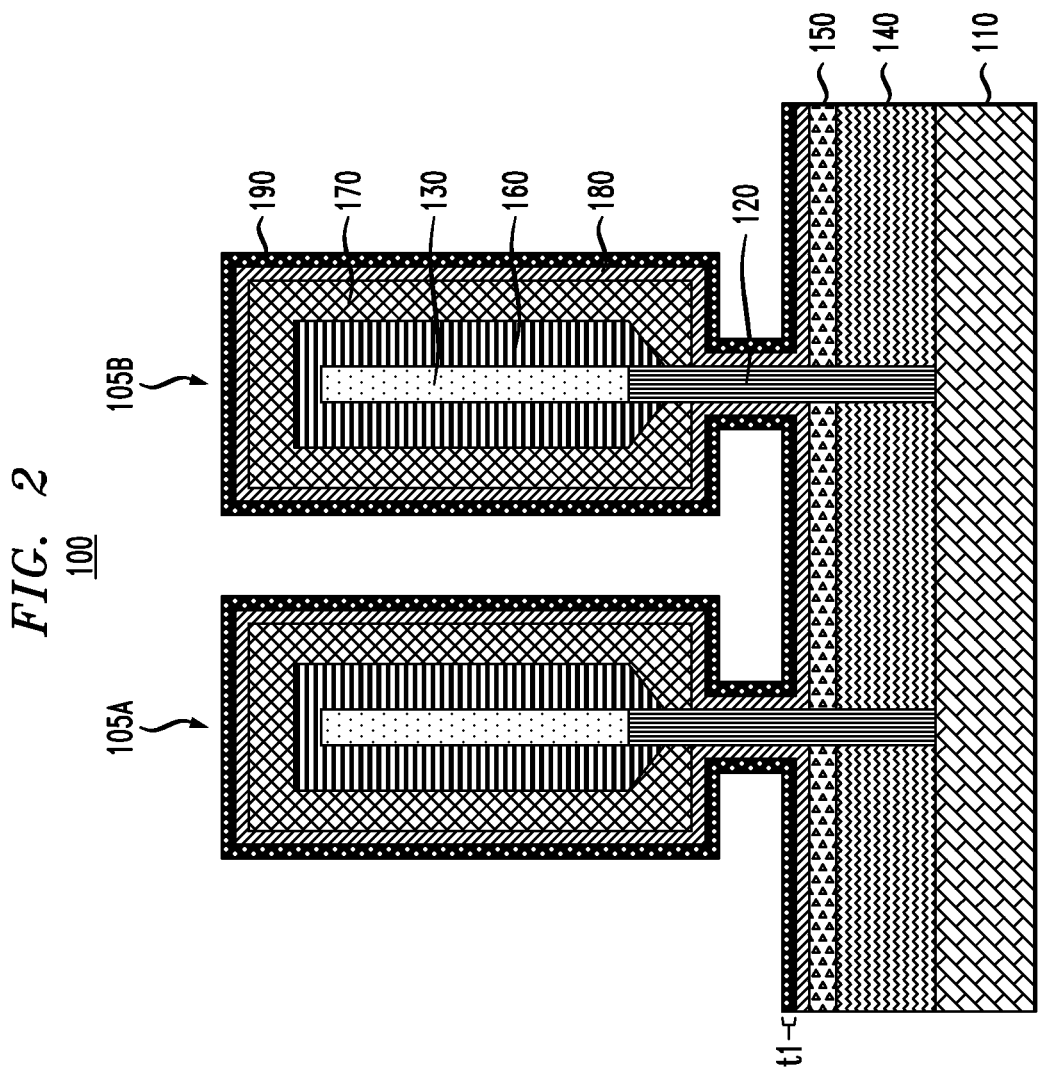
FIG. 2 is a cross-sectional view illustrating deposition of a first work function metal (WFM) layer on the a high-k dielectric layer of the substrate structure of FIG. 1, according to an exemplary embodiment of the present invention.

Referring now to FIG. 2, the fabrication of semiconductor structure 100 is illustrated after the formation of a first work-function metal (WFM) layer 190 on the high-k dielectric layer 180. In some embodiments, for example, first WFM layer 190 may be conformally deposited on high-k dielectric layer 180. For example, first WFM layer 190 may be deposited using atomic layer deposition (ALD). First WFM layer 190 may comprise, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or TaN, metal oxides, or metal nitrides. In some embodiments, first WFM layer 190 may be deposited to a thickness t1. For example, in some embodiments, first WFM layer 190 may be deposited to a thickness of 1 nm to 10 nm. First WFM layer 190 acts as gate material and also as a seed layer for the further formation of additional gate material.

Figure 3:
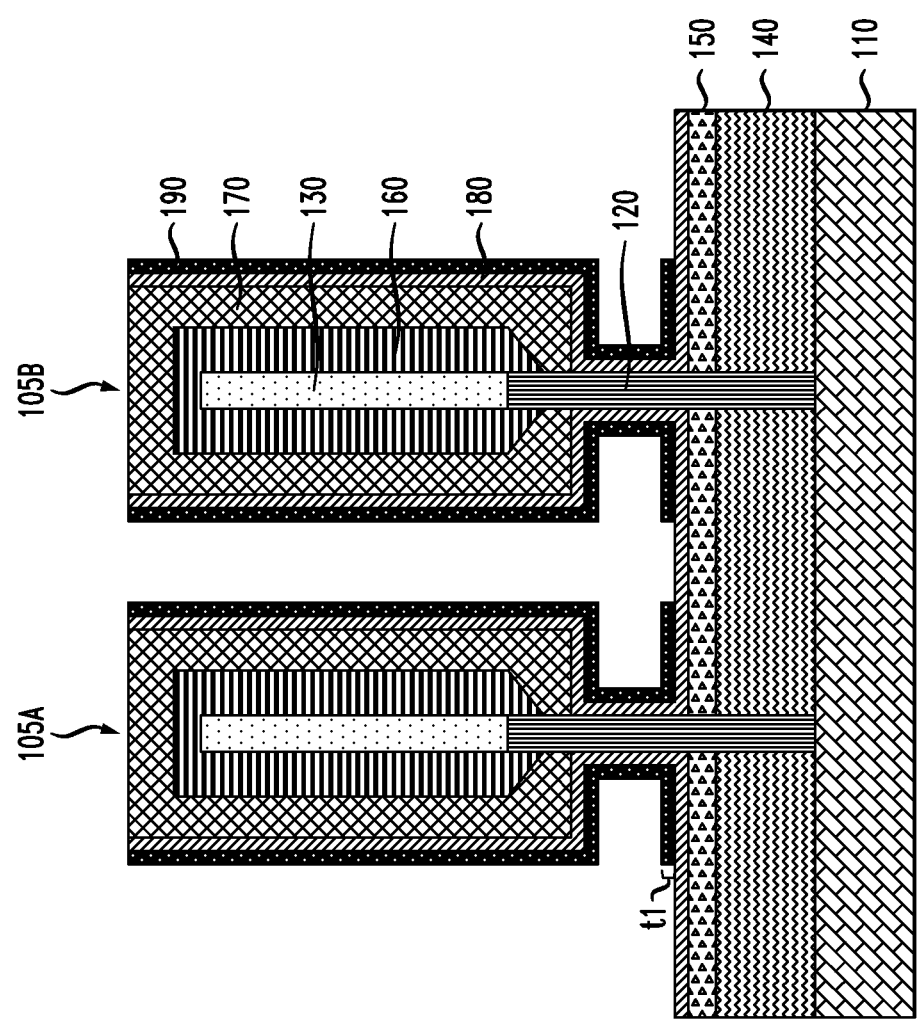
FIG. 3 is a cross-sectional view illustrating removal of a top portion of the first WFM layer and the high-k dielectric layer of the substrate structure of FIG. 2 to expose a portion of the top spacer, according to an exemplary embodiment of the present invention.

Referring now to FIG. 3, first WFM layer 190 and high-k dielectric layer 180 are etched back to expose the top spacer 170 and bottom spacer 150, for example using a directional etch. For example, the first WFM layer 190 and high-k dielectric layer 180 may be dry etched, e.g., using RIE, to expose the top spacer material 170 and bottom spacer 150. In some embodiments, for example, a chlorine-based etch chemistry may be used. In some embodiments, for example, a tetrafluoromethane ($CF_4$)/O2 based etch chemistry may be used.

Figure 4:
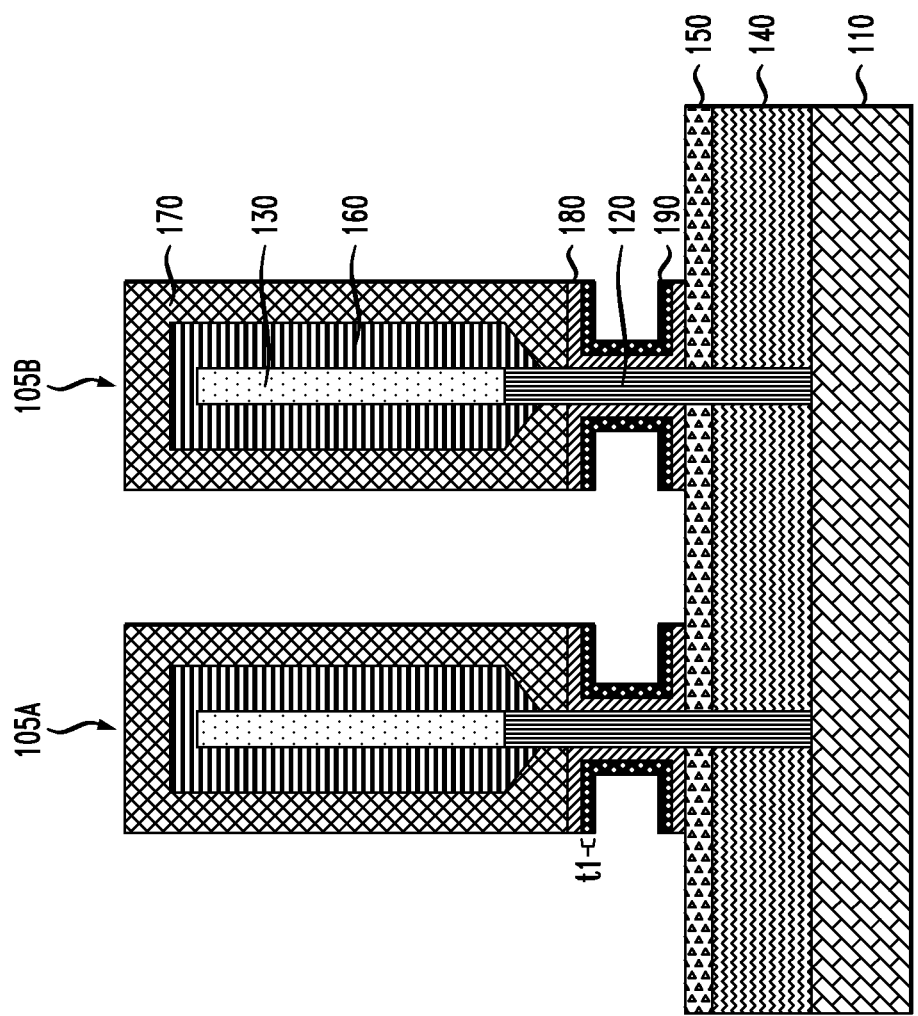
FIG. 4 is a cross-sectional view illustrating removal of portions of the first WFM layer and the high-k dielectric layer of the substrate structure of FIG. 3 to form gate regions of the VFETs, according to an exemplary embodiment of the present invention.

Referring now to FIG. 4, first WFM layer 190 and high-k dielectric layer 180 are further etched to expose the side walls of top spacer 170 and to remove corresponding material on bottom spacer 150, for example using a directional etch. For example, the first WFM layer 190 and high-k dielectric layer 180 may be dry etched, e.g., using RIE, to expose the side walls of the top spacer material 170 and remove the corresponding material on the bottom spacer 150. In some embodiments, a single etch process may be performed on the structure of FIG. 2 to achieve the structure illustrated in FIG. 4. As illustrated in FIG. 4, the first WFM layer 190 and high-k dielectric layer 180 form gate regions on each vertical field effect transistor 105A and 105B with high-k dielectric layer 180 in each gate region separating first WFM layer 190 from a respective fin 120.

Figure 5:
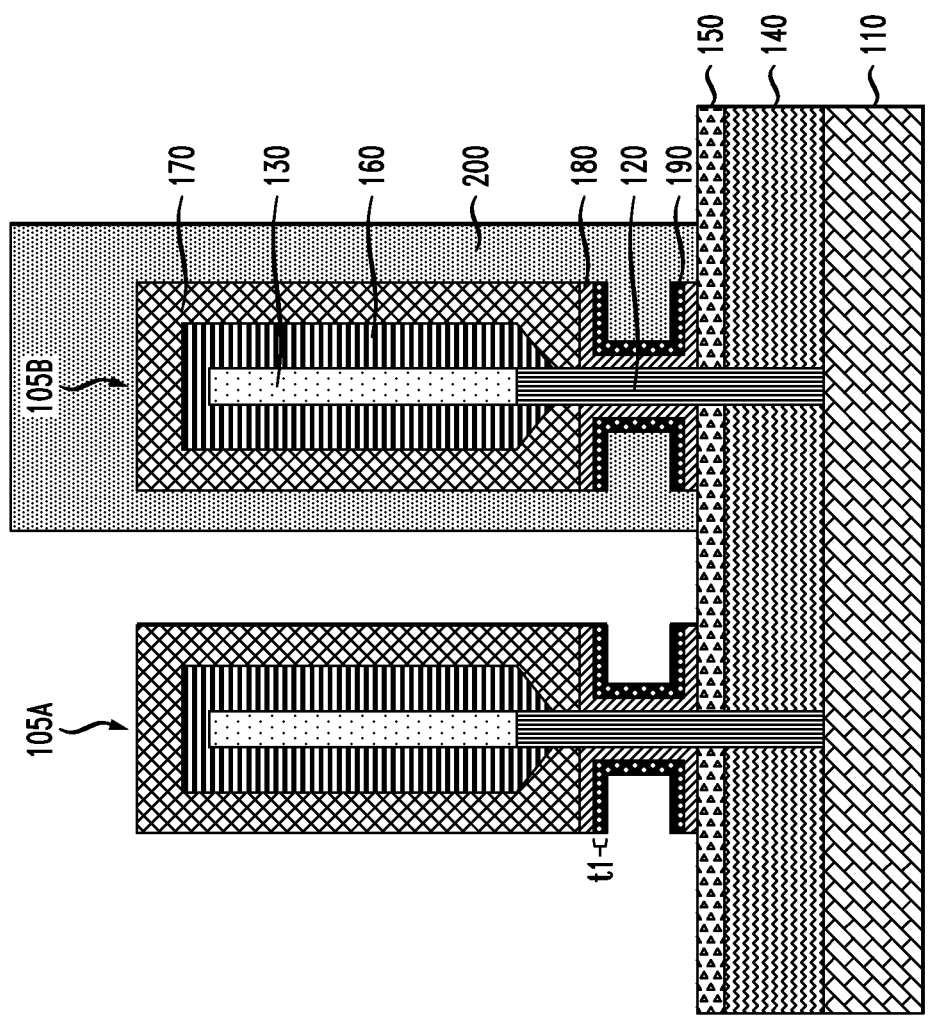
FIG. 5 is a cross-sectional view illustrating masking of a first of the VFETs of the substrate structure of FIG. 4, according to an exemplary embodiment of the present invention.

Referring now to FIG. 5, VFET 105B is masked to isolate VFET 105B from VFET 105A. For example, lithography may be used to pattern a resist mask 200 that covers VFET 105B but not VFET 105A. In some embodiments, for example, optical lithography, extreme ultraviolet lithography (EUV), nanoimprint lithography, or any other kind of lithography may be used to form resist mask 200. Resist mask 200 isolates VFET 105A relative to VFET 105B so that further processes may be performed on VFET 105A without affecting VFET 105B. While illustrated as a mask of VFET 105B, any number of VFETS on substrate structure 100 may be selectively masked.

Figure 6:
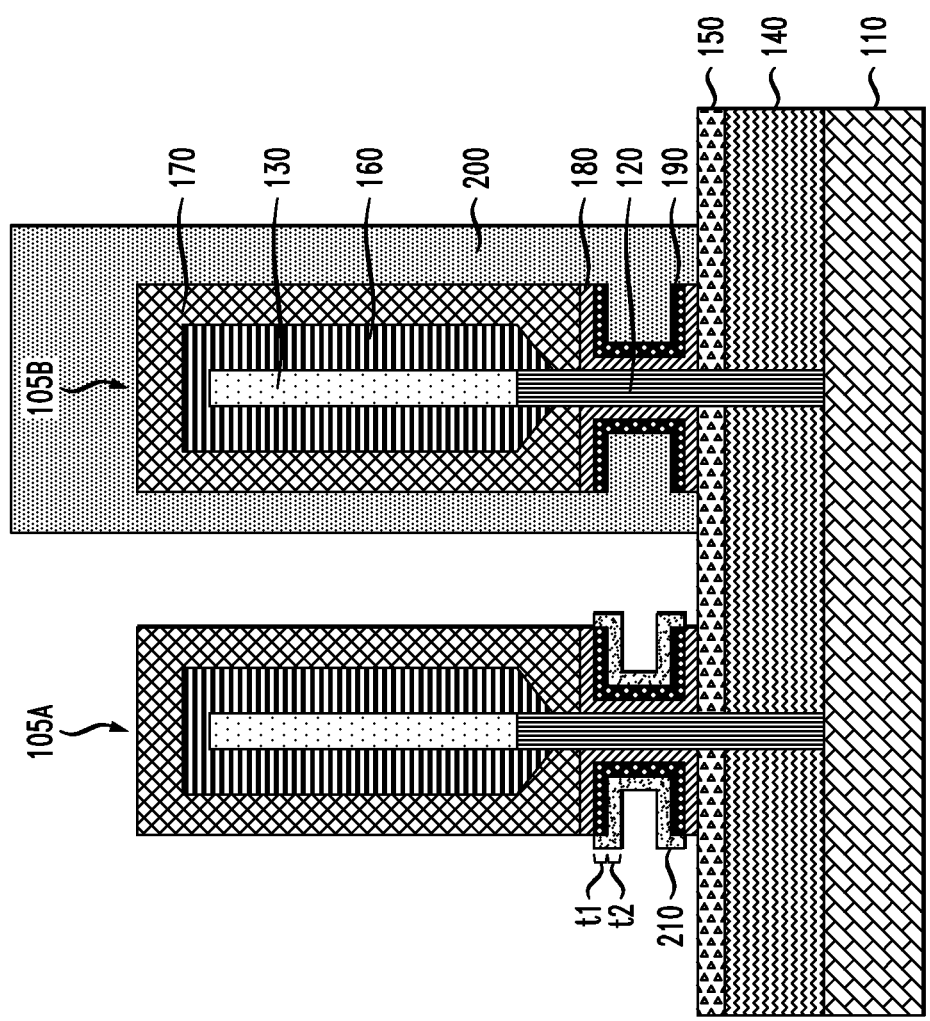
FIG. 6 is a cross-sectional view illustrating selective deposition of a second WFM layer on the first WFM layer of a second of the VFETs of FIG. 5, according to an exemplary embodiment of the present invention.

Referring now to FIG. 6, the fabrication of semiconductor structure 100 is illustrated after the selective formation of a second WFM layer 210 on the first WFM layer 190 of the non-masked VFET 105A. In some embodiments, for example, second WFM layer 210 may be selectively deposited only on first WFM layer 190. For example, second WFM layer 190 may be deposited using selective sidewall atomic layer deposition (ALD) with second WFM layer 190 comprising a material that will deposit on first WFM layer 190 selective to the other layers of substrate structure 100. Second WFM layer 210 may comprise, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or TaN, metal oxides, or metal nitrides.

In some embodiments, second WFM layer 210 may comprise the same material as first WFM layer 190. In some embodiments, for example, first WFM layer 190 may comprise TiN and second WFM layer 210 may also comprise TiN. In some embodiments, second WFM layer 210 may comprise similar material to first WFM layer 190 and may be selectively deposited on first WFM layer 190 due to the similarity. For example, first WFM layer 190 may comprise TiC and second WFM layer 210 may comprise TiN, first WFM layer 190 may comprise TiN and second WFM layer 210 may comprise TiC, first WFM layer 190 may comprise TiAlN and second WFM layer 210 may comprise TiN, first WFM layer 190 may comprise TiN and second WFM layer 210 may comprise TiAlN, first WFM layer 190 may comprise a metallic material that is not silicon-based, nitride-based, or oxygen-based, and second WFM layer 210 may also comprise a metallic material that is not silicon-based, nitride-based, or oxygen-based, or other similar combinations of materials.

In some embodiments, second WFM layer 210 may be deposited to a thickness t2. For example, the thickness of the second WFM layer 210 may be controlled by controlling the number of cycles in the ALD. In some embodiments, thickness t2 may be greater than, the same as, or less than thickness t1. As an example, in some embodiments, second WFM layer 210 may be deposited to a thickness of 1 nm to 10 nm. First WFM layer 190 and second WFM layer 210 together may act as gate material for VFET 105A where, for example, the threshold voltage needed to activate VFET 105A may be different than the threshold voltage needed to activate VFET 105B due to the difference in thickness of the gate material deposited on each respective VFET. For example, VFET 105B, having a first WFM layer 190 with a thickness t1 may have a first voltage threshold while VFET 105A, having both the first WFM layer 190 and the second WFM layer 210 with a thickness of t1+t2 will have a second voltage threshold that is different than the first voltage threshold. In some embodiments, for example, the first voltage threshold may be greater than the second voltage threshold. In some embodiments, for example, the first voltage threshold may be less than the second voltage threshold. For example, the difference in the voltage threshold for the first and second VFETs may depend on the material of the first and second WFM layers or the material combination of the first and second WFM layers.

Figure 7:
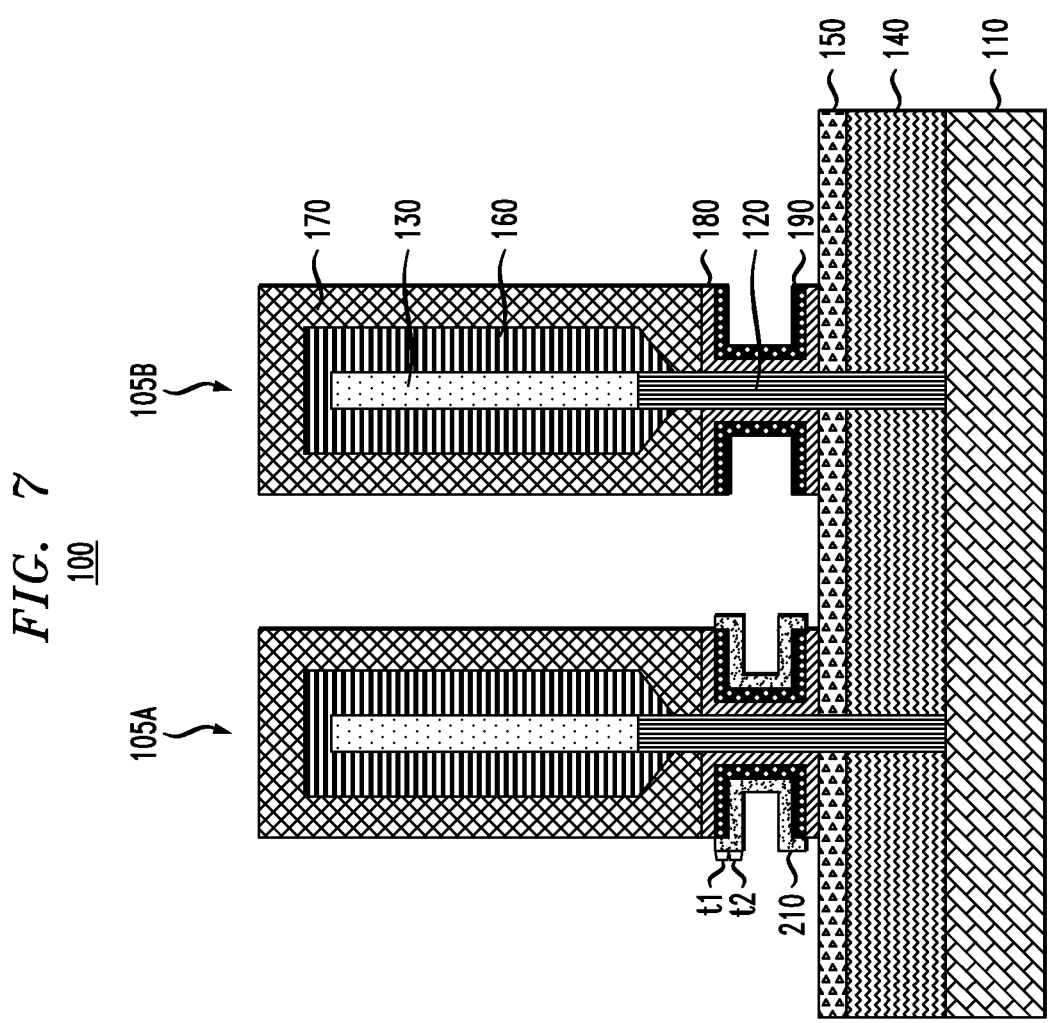
FIG. 7 is a cross-sectional view illustrating removal of the mask from the first of the VFETs of FIG. 6, according to an exemplary embodiment of the present invention.

Referring now to FIG. 7, resist mask 200 may be removed using conventional techniques. For example, a reactive ion etch (RIE) process containing oxygen-based, hydrogen-based, or other similar etch chemistry may be used to remove an organic layer such as resist mask 200 selective to the inorganic layers of substrate structure 100. For example, in some embodiments, an $O_2$ based plasma chemistry or a $N_2/H_2$ based plasma chemistry may be used to remove resist mask 200.

The above described fabrication process may be used to create VFETs having different threshold voltages on the same substrate structure.

Figure 8:
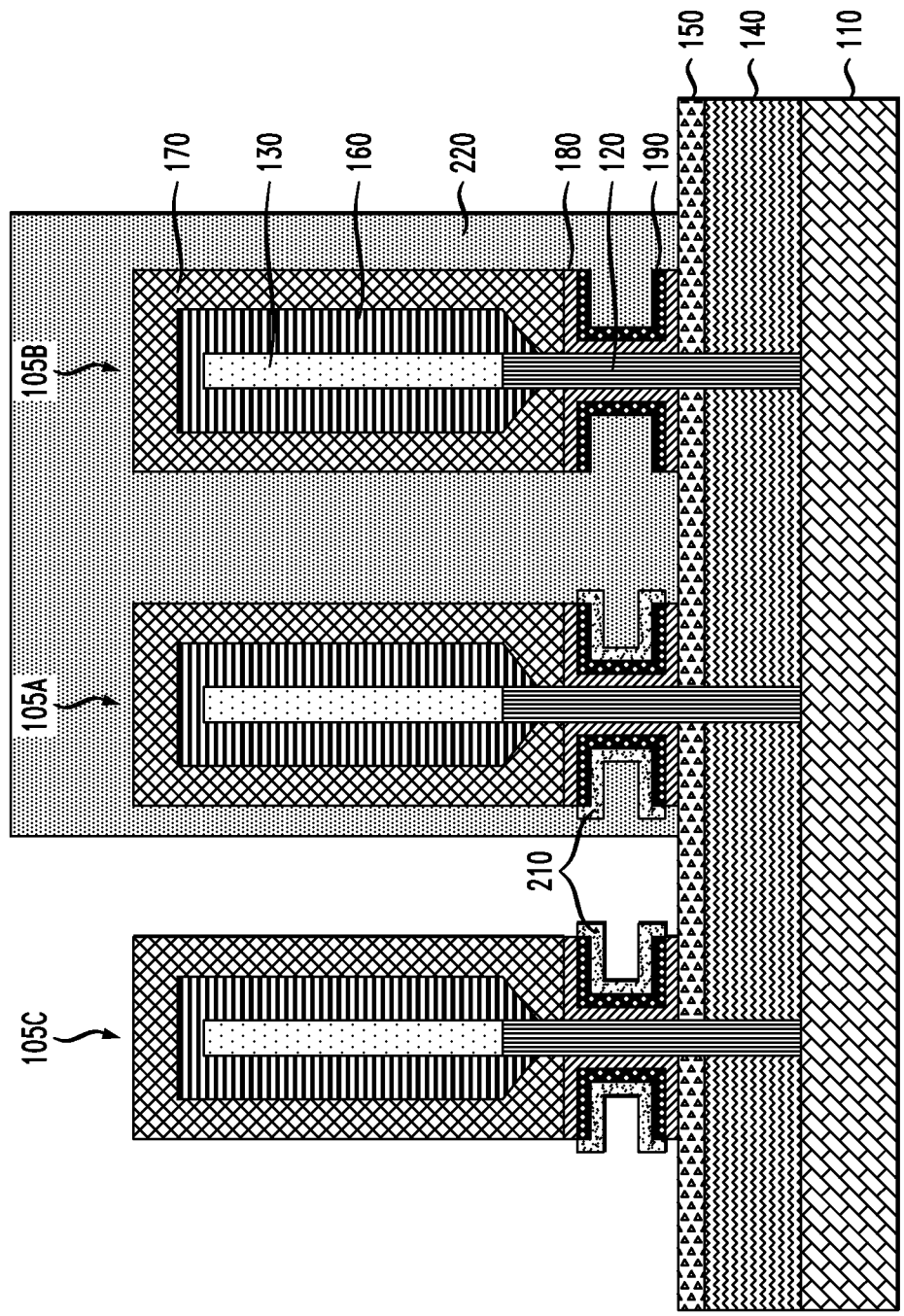
FIG. 8 is a cross-sectional view illustrating masking of the first and second VFETs of the substrate structure of FIG. 4, according to an exemplary embodiment of the present invention.
Figure 9:
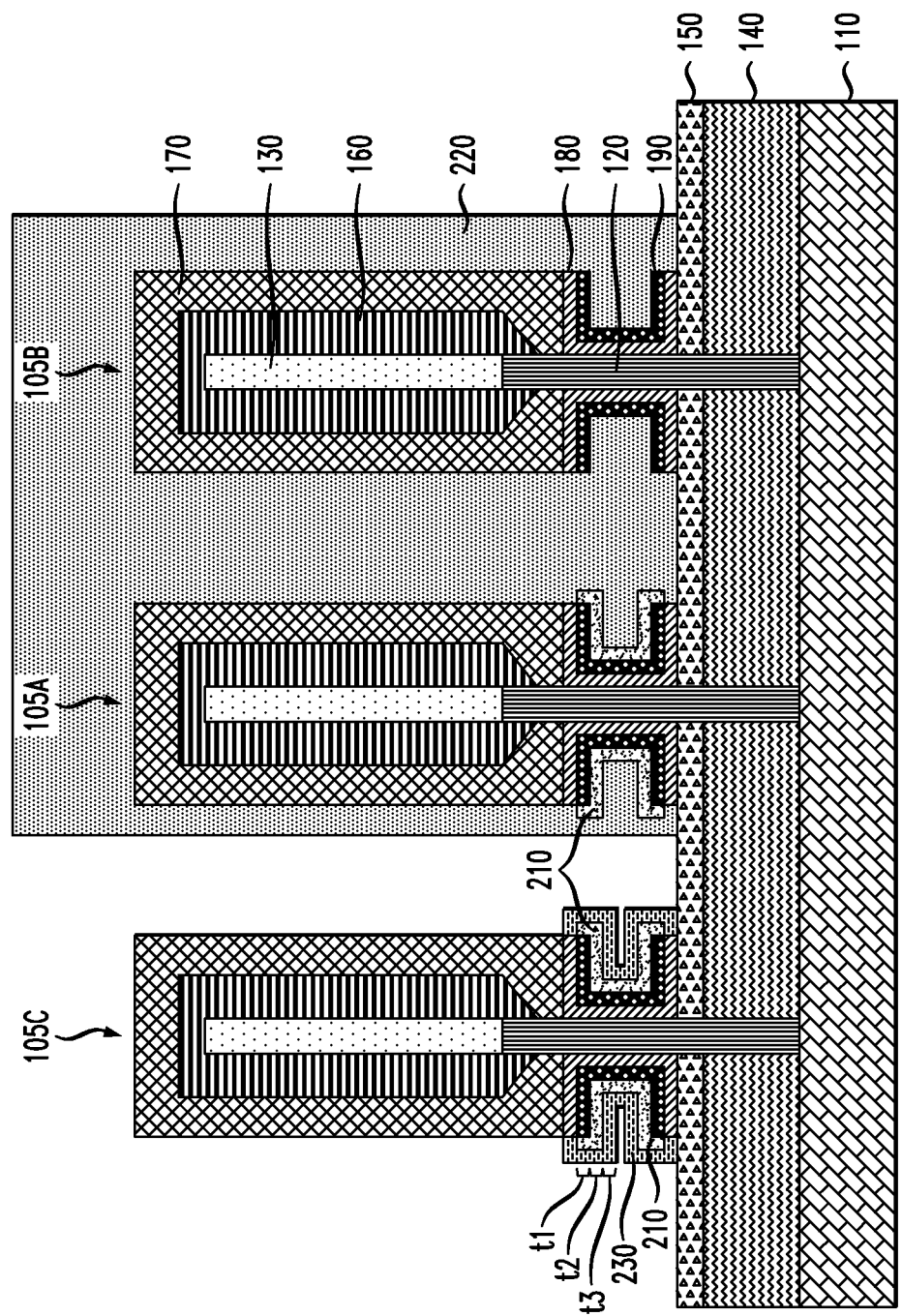
FIG. 9 is a cross-sectional view illustrating selective deposition of a third WFM layer on the second WFM layer of a third of the VFETs of FIG. 8, according to an exemplary embodiment of the present invention.
Figure 10:
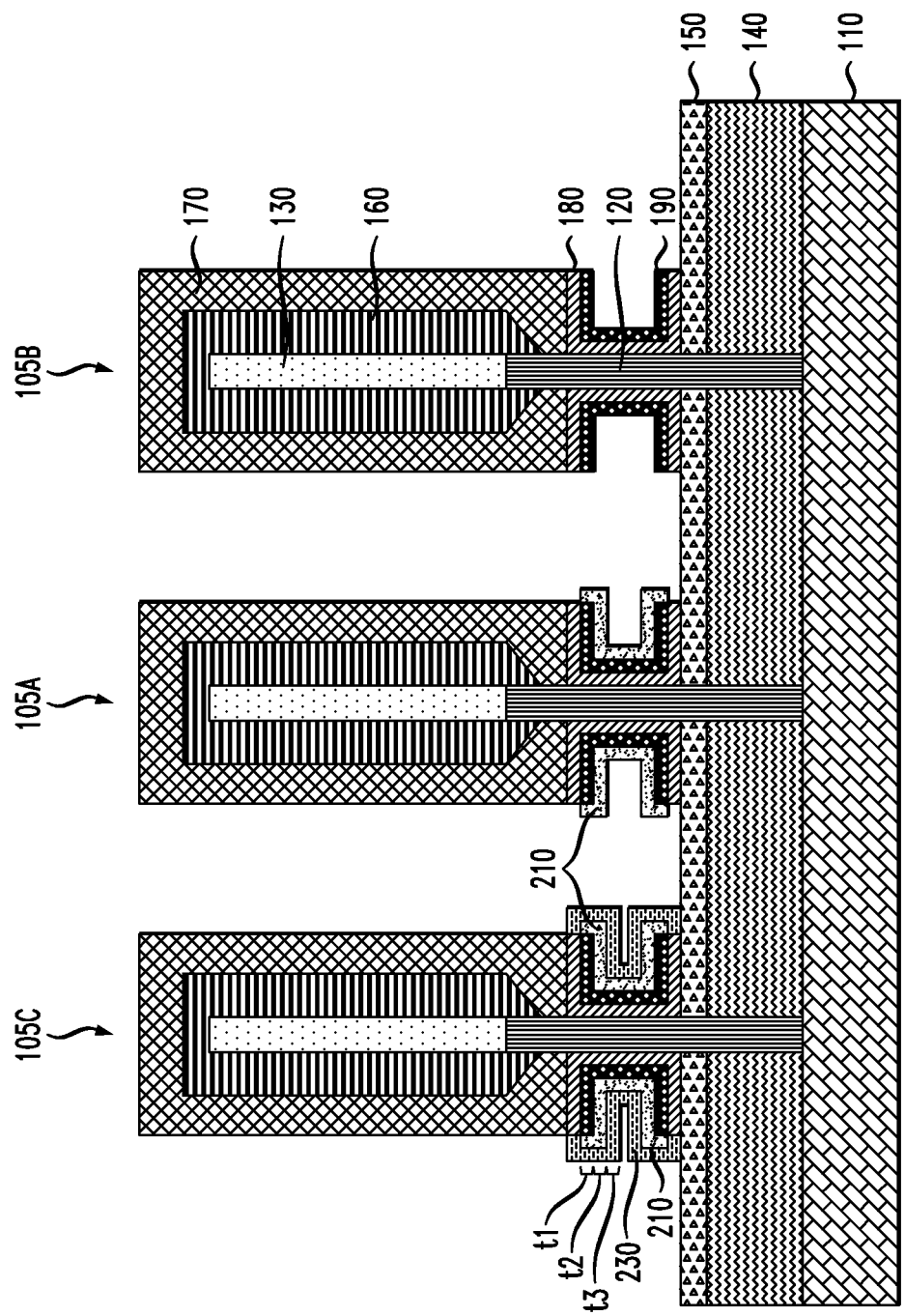
FIG. 10 is a cross-sectional view illustrating removal of the mask from the first and second VFETs of FIG. 9, according to an exemplary embodiment of the present invention.

In some embodiments, with reference now to FIGS. 8-10, the above fabrication process may be extended to fabricate additional VFETs on the same substrate structure that have threshold voltages that are different than VFETS 105A and 105B. For example, with reference now to FIG. 8, a VFET 105C is further illustrated. As illustrated in FIG. 8, VFET 105C has undergone the same process as VFET 105B, described above, including the addition of second WFM layer 210. As shown in FIG. 8, VFET 105C may be isolated relative to VFETS 105A and 105B using a resist mask 220 in a similar manner to that described above for the isolation of VFET 105A relative to VFET 105B.

Referring now to FIG. 9, the fabrication of semiconductor structure 100 is illustrated after the selective formation of a third WFM layer 230 on the second WFM layer 210 of the non-masked VFET 105C. In some embodiments, for example, third WFM layer 230 may be selectively deposited only on second WFM layer 210. For example, third WFM layer 230 may be deposited using atomic layer deposition (ALD) with third WFM layer 230 comprising a material that will deposit on second WFM layer 210 selective to the other layers of substrate structure 100. Third WFM layer 230 may comprise, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or TaN, metal oxides, or metal nitrides.

In some embodiments, third WFM layer 230 may comprise the same material as second WFM layer 210. In some embodiments, third WFM layer 230 may comprise the same material as first WFM layer 190. In some embodiments, third WFM layer 230 may comprise the same material as both first WFM layer 190 and second WFM layer 210. In some embodiments, for example, first WFM layer 190 may comprise TiN, second WFM layer 210 may comprise TiN, and third WFM layer 230 may also comprise TiN. In some embodiments, third WFM layer 230 may comprise similar material to one or both of first WFM layer 190 and second WFM layer 210 and may be selectively deposited on second WFM layer 210 due to the similarity. For example, second WFM layer 210 may comprise TiC and third WFM layer 230 may comprise TiN, second WFM layer 210 may comprise TiN and third WFM layer 230 may comprise TiC, second WFM layer 210 may comprise TiAlN and third WFM layer 230 may comprise TiN, second WFM layer 210 may comprise TiN and third WFM layer 230 may comprise TiAlN, second WFM layer 210 may comprise a metallic material that is not silicon-based, nitride-based, or oxygen-based, and third WFM layer 230 may also comprise a metallic material that is not silicon-based, nitride-based, or oxygen-based, or other similar combinations of materials.

In some embodiments, for example, the material used may alternate for each successive WFM layer. For example, first WFM layer 190 may comprise TiN, second WFM layer 210 may comprise TiC, and third WFM layer 230 may comprise TiN. In some embodiments, any order and combination of materials may be used for each successive WFM layer so long as the materials used for each new WFM layer may be selectively deposited on the predecessor WFM layer.

In some embodiments, third WFM layer 230 may be deposited to a thickness t3. In some embodiments, thickness t3 may be greater than, the same as, or less than thicknesses t1 and t2. As an example, third WFM layer 230 may be deposited to a thickness of 1 nm to 10 nm. First WFM layer 190, second WFM layer 210, and third WFM layer 230 together may act as gate material for VFET 105C where, for example, the threshold voltage needed to activate VFET 105C may be different than the threshold voltage needed to activate VFETs 105A and 105B due to the difference in thickness of the gate material deposited on each respective VFET. For example, VFET 105B, having a first WFM layer 190 with a thickness t1 may have a first voltage threshold, VFET 105A, having both the first WFM layer 190 and the second WFM layer 210 with a thickness of t1+t2 will have a second voltage threshold that is different than the first voltage threshold, and VFET 105C, having the first WFM layer 190, second WFM layer 210, and third WFM layer 230 with a thickness of t1+t2+t3 will have a third voltage threshold that is different than the first and second voltage thresholds.

Referring now to FIG. 10, resist mask 220 may be removed using conventional techniques. For example, a reactive ion etch (RIE) process containing oxygen-based, hydrogen-based, or other similar etch chemistry may be used to remove an organic layer such as resist mask 220 selective to the inorganic layers of substrate structure 100.

Further processes may be performed to complete the VFETs including the addition of top source/drain regions.

According to the above fabrication process in this embodiment, VFETs having three different threshold voltages may be fabricated on the same substrate structure. This fabrication process may be further extended to fabricate VFETs having additional different threshold voltages on the same substrate structure, for example, four different threshold voltages, five different threshold voltages, or a larger number of different threshold voltages.

The above described fabrication processes reduce or eliminate the need to fabricate gates of different thicknesses by depositing a certain metal species and thickness, using multiple lithography masking and etch steps to subsequently etch the material through timed wet or dry etching, and either completely remove and redeposit, or thin down, the material to desired thickness to achieve gate material on VFETs that have different thicknesses and therefore different threshold voltages. For example, since no wet or dry etching is necessary to add a new WFM layer the above deficiencies of patterning and etching are overcome.

The above described fabrication processes also inhibit undercutting of the material in a desired region due to the use of wet etch processes when removing additional material deposited on undesired regions since no wet etching is needed to remove any portion of the selectively deposited WFM layers. The above processes also avoid or inhibit deficiencies of some solutions to the undercutting where, for example, multiple blanket isolation etches may be used which may result in excessive gouging of the bottom spacer, which protects bottom source/drain. The above described processes also avoid the lack of precise thickness control that is caused by the use of a timed metal wet etch process, instead controlling the thickness directly during ALD on a cycle by cycle basis.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a first work function metal layer on a high-k dielectric layer of a substrate structure, the substrate structure comprising vertical field effect transistors;
    etching the first work function metal layer and the high-k dielectric layer to form gate regions for each vertical field effect transistor, the gate regions of a given one of the vertical field effect transistors comprising the first work function metal layer separated from a fin of a given one of the vertical field effect transistors by the high-k dielectric layer;
    forming a resist mask over a first of the vertical field effect transistors, the resist mask isolating the first of the vertical field effect transistors from a second of the vertical field effect transistors;
    selectively forming a second work function metal layer on the first work function metal layer of the gate region of the second of the vertical field effect transistors; and
    removing the resist mask.

2. The method according to claim 1, wherein a thickness of the first work function metal layer is the same as a thickness of the second work function metal layer.

3. The method according to claim 1, wherein the first work function metal layer and the second work function metal layer comprise the same material.

4. The method according to claim 1, wherein the first work function metal layer and the second work function metal layer comprise different materials.

5. The method according to claim 4, wherein the second work function metal layer comprises a material that is similar to the material of the first work function metal layer and is configured for selective formation of the second work function metal layer on the first work function metal layer.

6. The method according to claim 1, wherein the first work function metal layer comprises a material selected from the group consisting of titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or TaN, a metal oxide, and a metal nitride.

7. The method according to claim 1, wherein the second work function metal layer is formed on the first work function metal layer using selective atomic layer deposition.

8. The method according to claim 7, wherein a thickness of the second work function metal layer is controlled by controlling the number of cycles of the atomic layer deposition of the second work function metal layer on the first work function metal layer.

9. A method for manufacturing a semiconductor device, comprising:
    forming a first work function metal layer on a high-k dielectric layer of a substrate structure, the substrate structure comprising vertical field effect transistors;
    etching the first work function metal layer and the high-k dielectric layer to form gate regions for each vertical field effect transistor, the gate regions of a given one of the vertical field effect transistors comprising the first work function metal layer separated from a fin of a given one of the vertical field effect transistors by the high-k dielectric layer;
    forming a resist mask over a first plurality of the vertical field effect transistors, the resist mask isolating the first plurality of the vertical field effect transistors from a second plurality of the vertical field effect transistors;
    selectively forming a second work function metal layer on the first work function metal layer of the gate regions of the second plurality of the vertical field effect transistors;
    removing the resist mask; and
    forming a second resist mask over the first plurality of the vertical field effect transistors and a first subset of the second plurality of the vertical field effect transistors, the second resist mask isolating the first plurality of the vertical field effect transistors and the first subset of the second plurality of the vertical field effect transistors from a second subset of the second plurality of the vertical field effect transistors.

10. The method according to claim 9, further comprising selectively forming a third work function metal layer on the second work function metal layer of the gate regions of the second subset of the second plurality of the vertical field effect transistors.

11. The method according to claim 10, further comprising removing the second resist mask.

12. The method according to claim 11, wherein the gate regions of the first plurality of the vertical field effect transistors comprise a first thickness based on a thickness of the first work function metal layer.

13. A semiconductor device, comprising:
    a first vertical field effect transistor comprising a first work function metal layer disposed on a high-k dielectric layer in a gate region of the vertical field effect transistor, the high-k dielectric layer separating the first work function metal layer from a fin of the vertical field effect transistor, the first vertical field effect transistor having a first threshold voltage based on a thickness of the first work function metal layer; and
    a second vertical field effect transistor comprising the first work function metal layer disposed on the high-k dielectric layer in a gate region of the second vertical field effect transistor and a second work function metal layer disposed on the first work function metal layer, the second vertical field effect transistor having a second threshold voltage based on a combined thickness of the first work function metal layer and the second work function metal layer.

14. The semiconductor device according to claim 13, wherein a thickness of the first work function metal layer is the same as a thickness of the second work function metal layer.

15. The semiconductor device according to claim 13, wherein the first work function metal layer and the second work function metal layer comprise the same material.

16. The semiconductor device according to claim 13, wherein the first work function metal layer and the second work function metal layer comprise different materials.

17. The semiconductor device according to claim 16, wherein the second work function metal layer comprises a material that is similar to the material of the first work function metal layer and is configured for selective formation of the second work function metal layer on the first work function metal layer.

18. The semiconductor device according to claim 13, wherein the first work function metal layer comprises a material selected from the group consisting of titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or TaN, a metal oxide, and a metal nitride.

19. The semiconductor device according to claim 13, wherein the second work function metal layer is formed on the first work function metal layer using selective atomic layer deposition.

20. The semiconductor device according to claim 19, wherein a thickness of the second work function metal layer is controlled by controlling the number of cycles of the atomic layer deposition of the second work function metal layer on the first work function metal layer.

\* \* \* \* \*